United States Patent [19]

Crocker et al.

[11] 4,050,062
[45] Sept. 20, 1977

[54] SYSTEM FOR DIGITIZING AND INTERFACING ANALOG DATA FOR A DIGITAL COMPUTER

[75] Inventors: Thomas H. Crocker, Burlington; Barry N. Levitt, Framingham; Paul J. Suprenant, Chelmsford, all of Mass.

[73] Assignee: The United States of America as represented by the Secretary of the Air Force, Washington, D.C.

[21] Appl. No.: 604,527

[22] Filed: Aug. 14, 1975

[51] Int. Cl.² ............................................. G08C 15/06
[52] U.S. Cl. .................................... 340/183; 340/150; 179/15 A
[58] Field of Search ............. 340/347 AD, 183, 172.5, 340/150; 179/15 A, 18 J

[56] References Cited

U.S. PATENT DOCUMENTS

| 3,484,591 | 12/1969 | Trimble | 235/152 |
| 3,665,399 | 5/1972 | Zehr et al. | 340/183 UX |
| 3,685,031 | 8/1972 | Cook | 340/183 X |
| 3,793,636 | 2/1974 | Clark et al. | 340/183 X |
| 3,820,112 | 6/1974 | Roth | 340/347 AD |

OTHER PUBLICATIONS

Boinodiris, "Event Controller Useful for Analog Signal Handling," IBM Technical Disclosure Bulletin, vol. 16, No. 7, Dec. 1973, pp. 2094, 2095.

Drimaket al., "Multiplexing Apparatus," IBM Technical Disclosure Bulletin, vol. 9, No. 5, Oct. 1966, pp. 466, 467.

Analog Devices, Inc., "Analog-Digital Conversion Handbook," June 1972, pp. I-5, 26-33, 46-49, 106-111, pp. II-156, 157, III-80-83.

Primary Examiner—Thomas J. Sloyan
Attorney, Agent, or Firm—Joseph E. Rusz; Julian L. Siegel

[57] ABSTRACT

A system for digitizing and interfacing analog data from a plurality of amplitude modulated periodic signals with a computer in which an alternating reference signal is identified and sampled input data to be digitized is synchronized at the same time reference point of the waveform of the reference signal. Pulses from a real time clock are counted and synchronized with the reference signal and this synchronized signal is delayed and fed to a timing circuit which starts the multiplexing of the input signals and also activates an address counter to initialize the address locations in the computer. The analog data from the multiplexer is converted to digital values by an analog-to-digital converter and fed to the computer at the given address.

6 Claims, 3 Drawing Figures

SYSTEM FOR DIGITIZING AND INTERFACING ANALOG DATA FOR A DIGITAL COMPUTER

STATEMENT OF GOVERNMENT INTEREST

The invention described herein may be manufactured and used by or for the Government for governmental purposes without the payment of any royalty thereon.

BACKGROUND OF THE INVENTION

This invention relates to digital demodulation systems, and more particularly to an interface device between a plurality of analog signals and a digital computer.

A single point digital demodulation has many advantages including cost, size, power consumption, response time, and error reductions when compared with conventional analog electronic circuit demodulation techniques. The standard method of interfacing alternating signals to digital computers involves the use of an analog demodulator, for each of the input signals, so that the computer can select the read time via the analog-to-digital converter and multiplexer circuitry. The present invention employs a relatively small amount of timing circuitry to synchronize the sampling of the analog signal with its reference, thereby eliminating the need for extra demodulation. This new single point digital demodulation technique can be compared with the standard analog circuitry demodulation technique for six channels of input data as in a gimballed inertial system application. The cost of the new method is 39 dollars to implement compared to a cost of 144 dollars for the standard technique, thus representing a cost savings of almost 75 percent. The size of the new circuit would occupy only one-half of the volume required for the standard demodulation technique.

The conventional method, in addition to requiring extra circuitry, could introduce demodulation errors of up to 10 percent depending on filter criteria and time lags of up to one second depending on bandwidth.

There are many applications that exist for the system of the present invention, both in inertial systems and in other types of computer-controlled devices. It is a practical and useful system for feeding amplitude-modulated periodic signals into a digital computer. Other applications in addition to gimballed inertial systems that could employ this interfacing system include strapdown inertial systems (for the gyro torque rebalance loops), missile radar or optical seeker assemblies, angular measurement devices, and automatic test equipment interfaces.

SUMMARY OF THE INVENTION

The present invention is a method and system by which amplitude-modulated periodic signals can be digitized and interfaced with a computer directly, without the need for analog demodulation. The invention employs circuitry to identify an AC reference signal and to time-synchronize the sampling of the data so that the digitizing is always performed at the same time-referenced point of the waveform. Using this method, a computer can directly receive periodic (or aperiodic) updates proportional to the AC input signal levels.

This system provides a novel and effective means of accomplishing AC signal demodulation and signal transfer when sampling is involved. It is particularly adaptable when several frequency-locked signals are being interfaced and especially when the waveshape is square in format or has a flat region. Analog or digital filtering is not required when using this single point digital demodulation method and offers advantages by reducing cost, size, power consumption, and electronics errors.

It is therefore an object of the invention to provide a system for digitizing amplitude modulated periodic signals for direct interfacing with a computer without the need for conventional analog demodulation.

It is another object to provide a novel and improved method and system for alternating signal demodulation and signal transfer for use when sampling is required.

It is another object to provide a single point digital demodulation system eliminating analog and digital filtering.

It is still another object to provide a single point digital demodulation system having the advantages of reduced cost, size, power consumption, and electronic errors.

These and other objects, features and advantages of the invention will become more apparent from the following description when taken in conjunction with the illustrative embodiments of the accompanying drawings.

DETAILED DESCRIPTION OF THE PREFERRED EMBODIMENT

Figure 1:
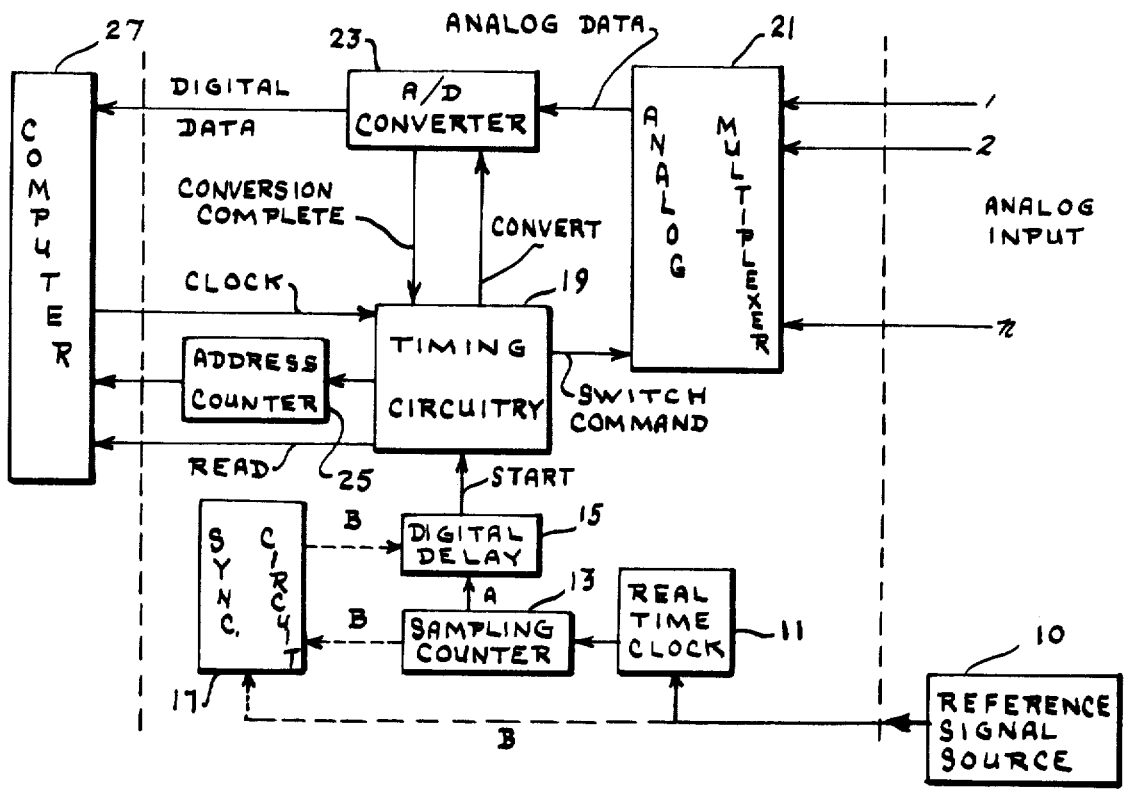
FIG. 1 is a block diagram of the digital demodulation system showing two embodiments, one where the real time clock is synchronous with the periodic signal reference, and a second where it is asynchronous with the periodic signal reference.

Referring to FIG. 1, there is shown a block diagram of the digital demodulation system using a periodic or alternating reference signal from source 10 which has the same frequency as the analog input data. The sampled period is established by real time clock 11 counting to a specified value as determined by sampling counter 13 which produces a sampling pulse upon reaching the designated count. Real time clock 11 can be either synchronous as shown by path A or asynchronous as shown by path B (dotted lines) with the periodic reference signal from source 10. If synchronous, the sample pulse can be used directly to trigger digital delay circuit 15. For the embodiment in which real time clock 11 is asynchronous with the reference signal, sampling counter 13 is then used to provide a pulse to wait for the leading edge of the reference signal prior to exciting delay 15. This synchronization is performed in synchronizing circuit 17.

At the end of a specified delay as determined by delay circuit 15, a start pulse is generated and fed to timing circuitry 19. This initializes multiplexer 21 with a switch command so that the first data item is inputted to analog-to-digital converter 23 and the initial address is entered into address counter 25. A convert pulse from timing circuitry 19 is transmitted to analog-to-digital converter 23 after which a read command is sent to digital computer 27. This action forces computer 27 to read the converted digital word into the designated memory address. If there is more than one item of data to be transmitted, a conversion complete signal from analog-to-digital converter 23 triggers timing circuitry 19 to advance multiplexer 21 and address counter 25 and to issue another convert pulse and read command. This sequence continues until all the input analog signals have been read into computer 27.

In an experimental procedure, Raytheon LCP III Inertial Platform was interfaced with a Bunker Ramo BR 1018 digital computer using this single point digital demodulation technique. The LCP III is a three-gimbal platform that has analog outputs representing the sine and cosine of each gimbal axis angle. This information is provided by square waves consisting of 500 Hz amplitude modulated signals which is the analog input. The signals are sampled by the computer every 20 milliseconds in order to provide program updates of the vehicle angular orientation.

Figure 2:
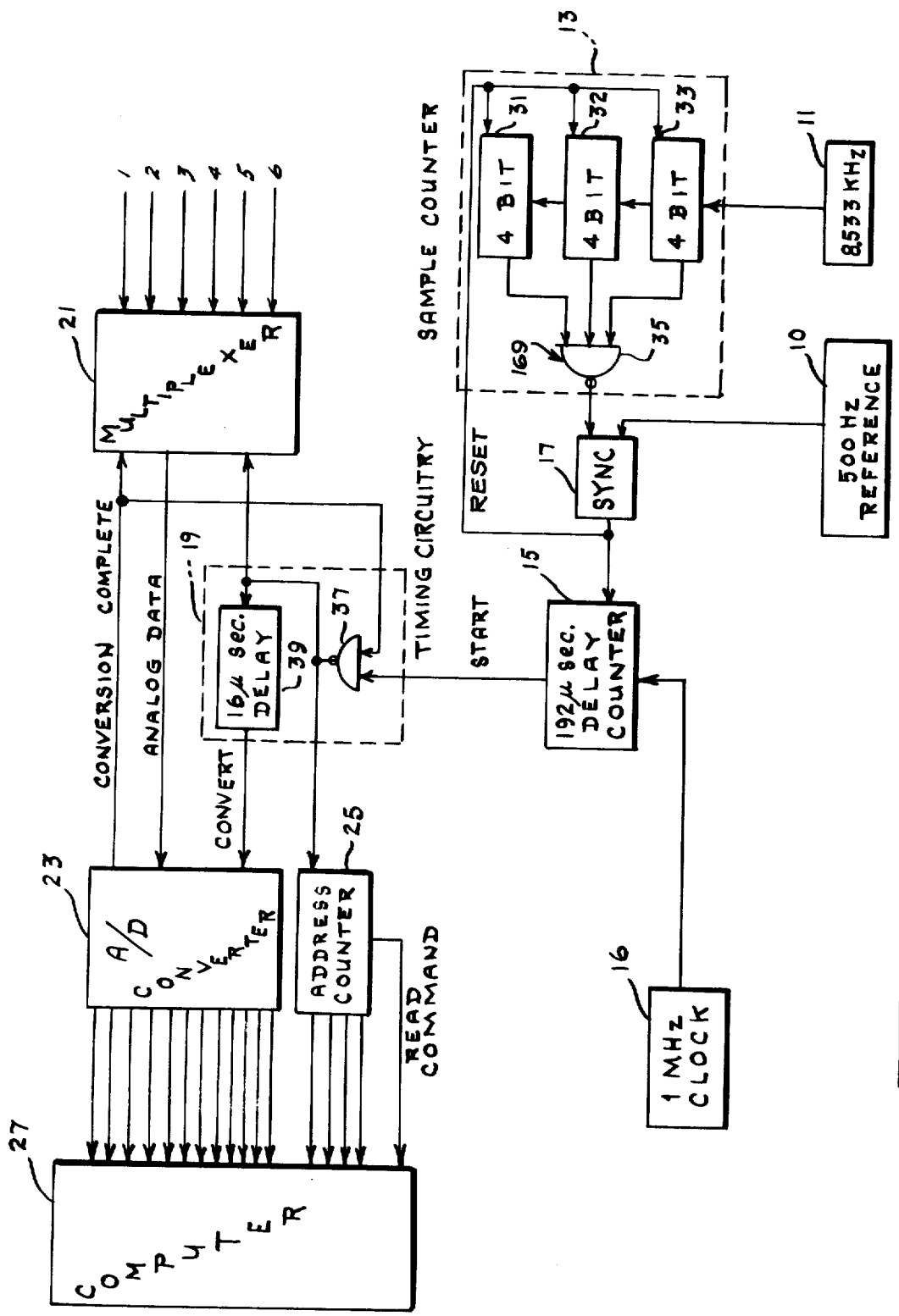
FIG. 2 is a schematic diagram of the digital demodulation system showing in greater detail the embodiment where the real time clock is asynchronous with the periodic signal reference.

A schematic of the digital demodulation circuitry employed in the asynchronous case is shown in FIG. 2. A 8.533 KHz signal from real time clock 11 can be used. The pulses are accumulated in sample counter 13 using three four-bit counters 31-33. The counter outputs are continuously tested for a sum of 169 (representing 20 milliseconds) in AND gate 35. This includes a 192 $\mu$sec delay and a 16 $\mu$sec delay totaling 20 milliseconds for entering a convert command to analog-to-digital converter 23. When this occurs, a sample signal is issued. The sample signal in turn excites synchronizing circuit 17 which is a JK flip-flop that is clocked by the 500 Hz reference source 10 thus synchronizing its output with the AC input data. The signal from synchronizing circuit 17 is then transmitted to delay counter 15 which provides a 192 $\mu$sec digital delay allowing the conversions to be performed on a flat portion of the input waveform. Counter 15 is pulsed by 1 MHz clock 16. The delayed signal is buffered and used to set address counter 25 and multiplexer 21 to their initial states through AND gate 37. This gate ensures that a conversion is complete before another convert command is generated. An additional delay of 16 $\mu$sec is obtained by using quad counter 39 in order to provide sufficient time for switching and settling transients. The signal from delay 39 is used to command the analog-to-digital converter 23. The conversion complete signal from analog-to-digital converter 23 activates the computer read command through timing circuit 19 so that the digital data contained in analog-to-digital converter 23 is entered into computer 27 at the designated address. The same conversion complete signal is used to advance multiplexer 21 and address counter 25 to the next state and to initiate the next convert pulse. This action continues until the nth piece of digital data is inputted into computer 27, after which a stop command is obtained from address counter 25 resetting the circuitry to the condition where it will wait for the next sample pulse.

Figure 3:
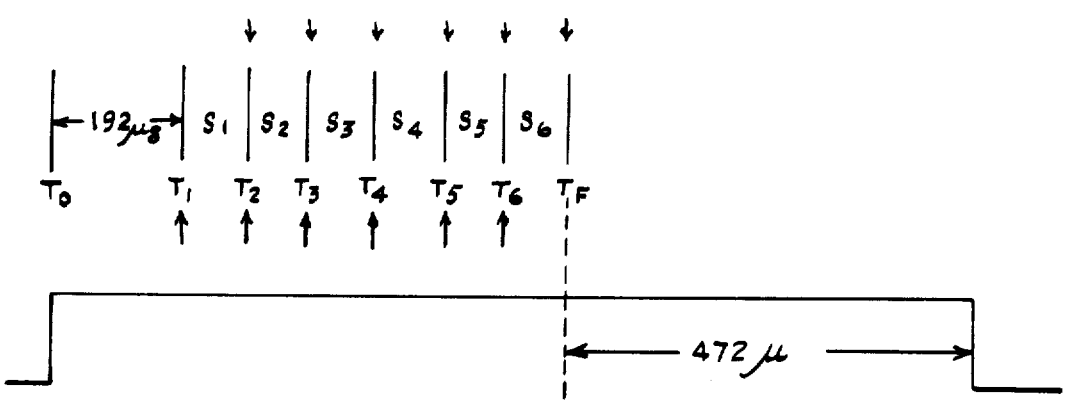
FIG. 3 is a timing diagram for the digital demodulation interface system.

A timing diagram for the digital demodulation interface described is shown in FIG. 3 where $T_o$ coincides with the receipt of the leading edge of the 500 Hz reference. After a 192 $\mu$sec delay, at $T_1$ multiplexer is in state $S_1$. At $T_1$ plus 16 $\mu$sec a convert is completed and the convert complete pulse is issued. This initiates a computer read command and puts multiplexer 21 in state $S_2$. This action continues (shown until the end of state 6) until a stop command is issued at $T_F$. The total time from $T_o$ until $T_F$ (for 6 inputs) is approximately 528 $\mu$s insuring that all gimbal angle readings are obtained during the flat region of the waveform.

Tests were conducted to verify the feasibility of using the described implementation. The tests included a series of calibrations to insure that the data obtained in the computer was indeed proportional to the analog input data. Initial verifications consisted of using an accurately measured voltage in place of each analog input signal, one at a time. The computer location corresponding to that input was interrogated and compared with the input value. The results compared within 1.0 percent and each computer output coincided with the corresponding analog input channel.

Within the computer, the sine and cosine of the platform gimbal angles were used to calculate the actual angle in arc minutes by employing an arc tangent routine. Several measurements were made to compare the platform attitudes with the measured angular outputs. The platform orientation data represents the angle in degrees, by which the outer case moved during the run. The system was operated in the navigate mode so that no alignment commands were present and the cluster, within gyro drift limits, remained at the designated angle. The gimbal output angle data was obtained directly from the computer teletype, representing the measured gimbal angles in arc minutes. The data showed an expected 180° (10800 minutes) phase shift present for the patch and roll axes. The overall $o$ readout error calculated was approximately 0.5 percent. Most of this error can be attributed to gyro drift (up to 5 deg/hr) occurring during the twenty-minute runs.

What is claimed is:

1. A system for interfacing a plurality of amplitude modulated signals with a digital computer comprising:
   a. an analog multiplexer fed by the plurality of amplitude modulated signals;
   b. an analog-to-digital converter fed by the analog multiplexer and read into the computer upon a read command, and with the analog-to-digital converter generating a conversion complete signal;
   c. a timing circuit generating an initializing switch command for advancing the analog multiplexer, a convert command to the analog-to-digital converter, and a read command to the computer;
   d. an alternating reference signal source having the same frequency as the plurality of amplitude modulated signals;
   e. a real time clock connected to and synchronous with the alternating reference signal;
   f. a sample counter fed by the real time clock and generating a start pulse to the timing circuit for initializing the multiplexer to input initial data to the analog-to-digital converter; and
   g. an address counter activated by the timing circuit for entering an initial address into the computer and advanced by signals from the timing circuit upon receiving a conversion complete signal from the analog-to-digital converter, and with the address counter generating a stop command upon completion of digital read-in.

2. An interfacing system according to claim 1 which further comprises a first delay circuit interposed between the sample counter and the timing circuit.

3. An interfacing system according to claim 2 wherein the timing circuit comprises:
   a. an AND gate fed by the delay circuit and the analog-to-digital converter, the output thereof being connected to the address counter and the analog multiplexer; and b. a second delay circuit fed by the AND gate and feeding the analog-to-digital converter.

4. A system for interfacing the plurality of amplitude modulated signals with a digital computer comprising:
   a. an analog multiplexer fed by the plurality of amplitude modulated signals;
   b. and analog-to-digital converter fed by the analog multiplexer and read into the computer upon a read command and with the analog-to-digital converter generating a conversion complete signal;
   c. a timing circuit generating an initializing switch command for advancing the analog multiplexer, a convert command to the analog-to-digital converter, and a read command to the computer;
   d. an altering reference signal source having the same frequency as the plurality of amplitude modulated signals;
   e. a sample counter fed by the real time clock generating a start pulse for initializing the multiplexer to input initial data to the analog-to-digital converter;
   f. a real time clock;
   g. a synchronizing circuit fed by the alternating reference signal source and the real time clock, the output thereof feeding the timing circuit; and
   h. an address counter activated by the timing circuit for entering an initial address into the computer and advanced by signals from the timing circuit upon receiving a conversion complete signal from the analog-to-digital converter, and with the address counter generating a stop command upon completion of digital read-in.

5. An interfacing system according to claim 4 which further comprises a first delay circuit interposed between the sampling circuit and the timing circuit.

6. An interfacing system according to claim 5 which further comprises:
   a. an AND gate fed by the delay circuit and the analog-to-digital converter, the output thereof being connected to the address counter and the analog multiplexer; and
   b. a second delay circuit fed by the AND gate and feeding the analog-to-digital converter.

* * * * *